United States Patent [19]

Buhrer et al.

[11] 4,334,628

[45] Jun. 15, 1982

[54] VACUUM-TIGHT ASSEMBLY

[75] Inventors: Carl F. Buhrer; Alfred E. Feuersanger, both of Framingham, Mass.

[73] Assignee: GTE Laboratories Incorporated, Waltham, Mass.

[21] Appl. No.: 209,162

[22] Filed: Nov. 21, 1980

[51] Int. Cl.[3] ........................ H01J 61/30; F16D 1/00; H05K 15/06; H01B 17/06

[52] U.S. Cl. .............................. 220/2.1 R; 174/50.61; 174/50.63; 174/152 GM; 403/28; 403/179; 428/35

[58] Field of Search .................. 220/2.1 R; 174/50.61, 174/50.63, 152 GM; 403/28, 179; 428/35

[56] References Cited

U.S. PATENT DOCUMENTS 3,061,664 10/1962 Kegg ............................... 220/2.1 R 3,275,358 9/1966 Shonebarger ....................... 403/179

3,435,180 3/1969 Kershaw .......................... 174/50.61

4,197,957 4/1980 Buhrer ............................ 220/2.1 R

OTHER PUBLICATIONS

Hansen, "Constitution of Binary Alloys", McGraw-Hill, New York, (1958), pp. 976-978.

*Primary Examiner*—William R. Dixon, Jr.

*Attorney, Agent, or Firm*—William R. McClellan; Ivan L. Ericson

[57] ABSTRACT

A vacuum-tight assembly, such as a discharge tube for a sodium vapor arc lamp, includes a high density polycrystalline ceramic body, such as alumina or yttria, having a cavity, at least one closure member, and a sealing material. The closure member is formed from a molybdenum-titanium alloy containing a small amount of nickel, cobalt, or copper. The nickel, cobalt, or copper forms a relatively low melting eutectic with titanium, thereby facilitating fabrication of closure members by sintering. The closure member and the sealing material have thermal coefficients of expansion closely matched to the thermal coefficient of expansion of the ceramic body over a wide temperature range.

10 Claims, 2 Drawing Figures

VACUUM-TIGHT ASSEMBLY

CROSS REFERENCE TO RELATED APPLICATION

Buhrer, "Vacuum-Tight Assembly", Ser. No. 209,242 filed concurrently with the present application and assigned to the same assignee as the present application, discloses portions of the subject matter herein disclosed.

BACKGROUND OF THE INVENTION

This invention relates to sealing of cavities in high density polycrystalline ceramic bodies and, more particularly, to the sealing of high pressure discharge lamps composed of alumina, yttria and the like.

Electrical discharge devices, such as high pressure sodium vapor arc lamps, commonly utilize transparent or translucent high temperature refractory tubes composed of alumina. Within the alumina tube an electric arc extends between two tungsten electrodes to which current is conducted by a hermetically sealed feedthrough assembly. Because alumina and niobium metal have nearly equal thermal coefficients of expansion, a niobium tube or a niobium wire is used in high pressure sodium vapor lamps to conduct electrical current through the ends of the alumina arc tube. The joint between the niobium metal and the alumina is typically filled with a meltable frit based on calcium aluminate. Thus, the feedthrough assembly not only seals the discharge tube but also conducts electrical current through the end of the alumina arc tube.

While niobium is generally satisfactory as a closure member for alumina arc tubes, it is a relatively expensive metal and is in potentially short supply under certain world conditions. It is, therefore, desirable to provide a substitute for niobium in the sealing of high pressure arc discharge tubes.

As disclosed in copending application Ser. No. 209,242, closure members for polycrystalline ceramic bodies can be formed from molybdenum alloys containing titanium. A preferred method of fabricating closure members from molybdenum alloys is by sintering. However, because of the high melting points of the molybdenum alloy and its constituents, sintering is difficult. It is, therefore, desirable to provide molybdenum-titanium alloy compositions which can be easily sintered.

SUMMARY OF THE INVENTION

According to the present invention, a vacuum-tight assembly includes a high density polycrystalline ceramic body having a cavity and means for sealing the cavity from the atmosphere. The ceramic body has a thermal coefficient of expansion between about $55\times10^{-7}$/°C. and $90\times10^{-7}$/°C. The means for sealing comprises at least one closure member formed from a molybdenum alloy and a sealing material. The molybdenum alloy contains between 2 and 70 atom percent titanium and between 0.1 and 5 weight percent of a metal selected from the group consisting of nickel, cobalt, copper and mixtures thereof. The closure member and the sealing material have thermal coefficients of expansion closely matched to the thermal coefficient of expansion of the ceramic body over a wide temperature range.

According to one preferred embodiment of the invention, an alumina discharge tube is sealed by a closure member formed from a molybdenum alloy containing between 35 and 65 atom percent titanium and between 0.5 and 2 weight percent nickel.

Figure 2:
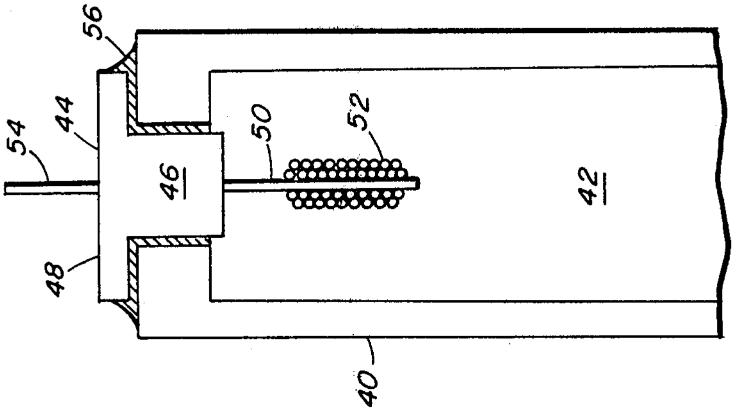
FIG. 2 is a cross-sectional view of a preferred embodiment of a vacuum-tight assembly according to the present invention.

For a better understanding of the present invention, together with other and further objects, advantages and capabilities thereof, reference is made to the following disclosure and appended claims in connection with the above-described drawings.

DETAILED DESCRIPTION OF THE INVENTION

A polycrystalline ceramic body, such as a high pressure discharge tube, having a cavity is sealed with a molybdenum alloy and a sealing material to form a vacuum-tight assembly. Polycrystalline alumina, having an average thermal expansion coefficient of $81\times10^{-7}$/°C. between the temperatures of 25° C. and 800° C., is commonly used for discharge tubes in high pressure sodium vapor arc lamps. Yttria, having an average thermal expansion coefficient of $78\times10^{-7}$/°C. between 25° C. and 800° C., is also used in the fabrication of discharge tubes.

The operational temperature of the seal region of high pressure sodium discharge tubes is typically between ambient temperature, or about 25° C., when the device is turned off and 800° C. when fully warmed up. To avoid cracking or other destruction of the hermetic seal between the ceramic body and the closure member, it is necessary that the closure member and the sealing material have thermal coefficients of expansion closely matched to the thermal coefficient of expansion of the ceramic body over the operating temperature range of the seal region. While high pressure sodium discharge tubes have a typical operating temperature range between 25° C. and 800° C., other vacuum-tight assemblies according to the present invention can experience greater or lesser operating temperature ranges and thus require matching of thermal expansion coefficients over a correspondingly greater or lesser temperature range. The closure members and the sealing material should have thermal coefficients of expansion which are matched within seven percent to the thermal coefficient of expansion of the ceramic body to provide a reliable seal.

Although the maximum temperature of the seal region of the discharge tube during normal operation is about 800° C., the process used to seal the discharge tube employs temperatures of about 1400° C. Therefore, the closure member material must have a relatively high melting point. In addition, the material used to seal the discharge tube should have a low vapor pressure in order to avoid darkening of the lamp outer jacket and should be unreactive toward the discharge tube fill material.

When molybdenum is alloyed with titanium, a suitable closure member for a cavity in a polycrystalline ceramic body is formed. Titanium forms a continuous series of body centered cubic solid solutions with molybdenum above 882° C. or when the titanium concentration is below a critical concentration that decreases with decreasing temperature, as shown by Hansen in "Constitution of Binary Alloys", McGraw-Hill, N.Y., 1958, pp 976–978. A second hexagonal phase can separate at higher titanium concentrations. In the preferred composition range for sealing alumina, the titanium concentration is between 35 and 65 atom percent and the temperature at which a second phase of α-Ti could precipitate is between room temperature and 400° C. Although these alloys are allowed to cool below this temperature range, no evidence of any such α-Ti phase separation has been seen in x-ray diffraction patterns, probably because of the slow kinetics of such a low temperature phase precipitation.

Molybdenum, a refractory metal, has an average thermal expansion coefficient of $55\times10^{-7}$/°C. between 25° C. and 800° C. Titanium has an average thermal expansion coefficient of $104\times10^{-7}$/°C. between 25° C. and 800° C. By properly selecting the ratio of the component metals in the molybdenum alloy, the average thermal expansion coefficient between 25° C. and 800° C. is adjusted upward from that of molybdenum, such that it closely matches the thermal expansion coefficient of the ceramic body to be sealed. For example, a molybdenum-titanium alloy containing 50 atom percent of each element has an average thermal expansion coefficient of $81\times10^{-7}$/°C. between 25° C. and 800° C. Therefore, this alloy has a coefficient of thermal expansion substantially equal to that of alumina and can be used as a closure member for alumina arc discharge tubes. Other thermal coefficients of expansion between $55\times10^{-7}$/°C. and $90\times10^{-7}$/°C. can be matched by varying the concentration of titanium relative to molybdenum. The thermal coefficient of expansion of the molybdenum alloy increases more or less linearly from $55\times10^{-7}$/°C. as the concentration of titanium is increased.

A molybdenum alloy containing between 2 and 70 atom percent titanium can be used as the closure member for sealing a cavity in a high density polycrystalline ceramic body when the ceramic body has a thermal coefficient of expansion between about $55\times10^{-7}$/°C. and $90\times10^{-7}$/°C. When the ceramic body is alumina or yttria, it is preferred that the molybdenum alloy contain between 35 and 65 atom percent titanium. When the titanium concentration is outside the range of 35 to 65 atom percent, the resultant molybdenum alloy does not have thermal characteristics which sufficiently match those of alumina or yttria to provide reliable sealing.

One preferred method of fabricating molybdenum-titanium alloy closure members is by sintering. However, because of the high melting point of the molybdenum alloy and its constituents, sintering is difficult. A desirable sintering temperature is about 1500° C. It has been found that the addition to the molybdenum-titanium alloy of a small amount of nickel, cobalt or copper facilitates sintering of the molybdenum alloy by forming a liquid intergranular phase at a sintering temperature of 1500° C. The sintering aids of the present invention, nickel, cobalt, copper and mixtures thereof, form with titanium a eutectic which melts at about 1000° C. The sintering aids are used in concentrations of between 0.1 and 5 weight percent. At sintering aid concentrations above 5 percent, the composition deforms or melts completely during sintering. A preferred sintering aid concentration is between about 0.5 weight percent and 2 weight percent. One particularly preferred sintering aid is nickel.

In fabricating molybdenum alloy closure members by sintering, the alloy component metal powders and the sintering aid powders are ground together and pressed into a large pellet for a first heating cycle. The pressure used is about 90,000 lbs. per square inch and the firing cycle is 7 minutes at 1500° C. in vacuum. The large pellet is reground when cooled and the powder pressed in a small hardened steel die having provision for forming holes to accommodate electrode rods as described hereinafter. Electrode rods are then inserted into the pressed part and the assembly is sintered for 7 minutes at 1500° C.

Compositions with 2 weight percent nickel, 32.5 weight percent titanium and 65.5 weight percent molybdenum have been used to fabricate sintered parts having a thermal expansion coefficient of $86\times10^{-7}$/°C. This thermal expansion coefficient is slightly higher than that of the molybdenum alloy without nickel and is due to the presence of a solidified eutectic grain boundary phase containing $Ti_2Ni$. While the parts containing 2 weight percent nickel exhibit porosities of less than 1 percent, the sintered parts are somewhat brittle. Compositions with 1 weight percent nickel, 33 weight percent titanium and 66 weight percent molybdenum form a homogeneous solution after sintering with no grain boundary phase. The porosity of sintered parts with 1 weight percent nickel is less than 10 percent.

Figure 1:
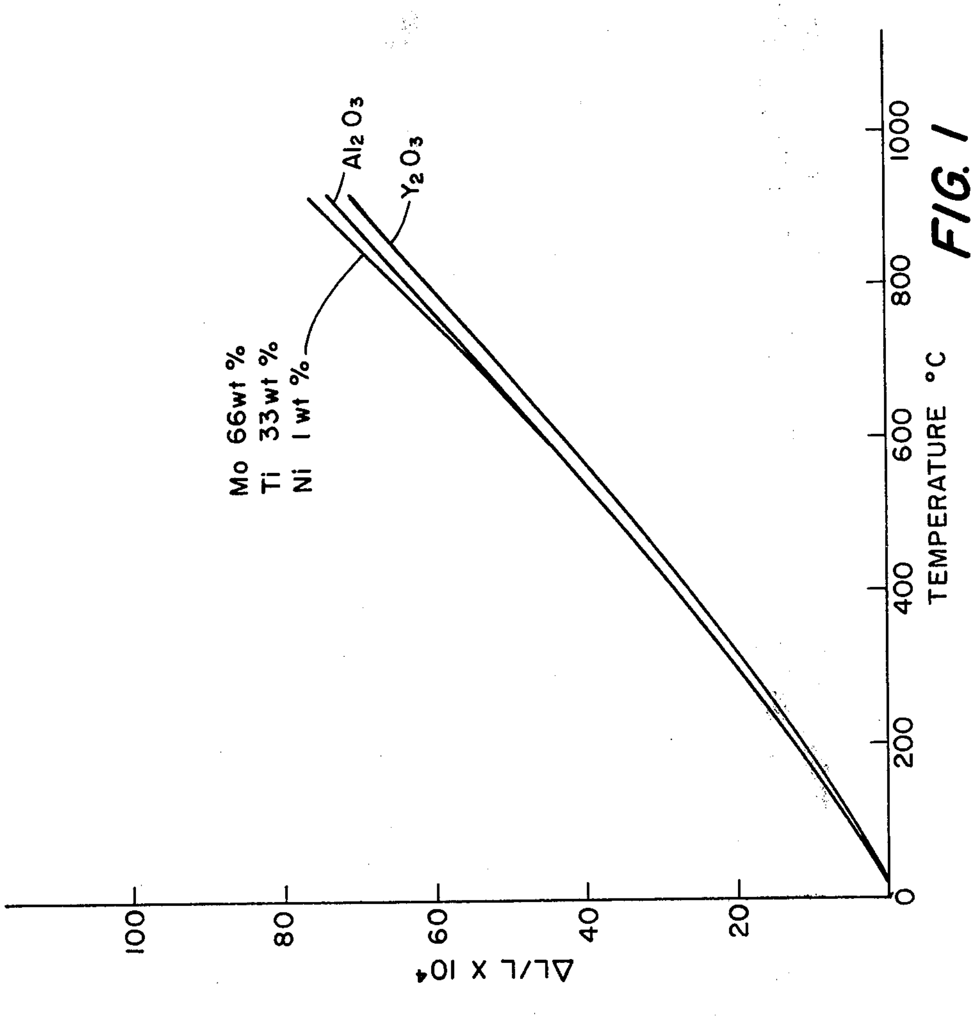
FIG. 1 is a graphic diagram illustrating the thermal expansion of alumina, yttria, and a molybdenum-titanium-nickel alloy as a function of temperature.

Referring now to FIG. 1, there is shown a graphic diagram illustrating the expansion curves of alumina, yttria and a molybdenum-titanium alloy containing 66 weight percent molybdenum, 33 weight percent titanium and 1 weight percent nickel as a function of temperature. The closely matched thermal characteristics of alumina and the molybdenum-titanium alloy are illustrated in FIG. 1. FIG. 1 also illustrates the matching in thermal characteristics between yttria and the molybdenum-titanium alloy.

The construction of a vacuum-tight feedthrough assembly for a high pressure sodium vapor lamp is shown in FIG. 2. A discharge tube 40, formed from alumina, yttria or other transparent ceramic material, includes a cavity 42 which contains the lamp fill material and an opening through an end thereof. A closure member 44 formed from a sintered molybdenum-titanium alloy as described hereinabove is located in the opening in the discharge tube 40. The closure member 44 has a generally cylindrical portion 46 which is slightly smaller than the opening in the discharge tube 40 and a lip portion 48 which is larger than the opening in the discharge tube 40. The lip portion 48 holds the closure member 44 in position during the sealing process. An electrode assembly includes a tungsten rod 50 and a tungsten coil 52 impregnated with emissive activator material such as calcium barium tungstate. The tungsten rod 50 and a molybdenum connection lead 54 are pressed into holes on opposite sides of the closure member 44 and are bonded therein during sintering as described hereinabove or welded in place after sintering.

During sealing of the discharge tube 40, a sealing material 56 is placed between the closure member 44 and the discharge tube 40. The sealing material 56 is typically a meltable frit based on calcium aluminate. The assembly is then heated to about 1400° C. to melt the sealing material 56 and cause it to flow into the space between the discharge tube 40 and the closure member 44, thereby providing a vacuum-tight feedthrough assembly.

The following examples are for the purpose of further illustrating and explaining the present invention and are not to be taken as limiting in any regard. Unless otherwise indicated, all parts and percentages are by weight.

EXAMPLE I

A molybdenum alloy was prepared from 65.5 percent Sylvania type 390/325 mesh molybdenum, 32.5 percent RMI Company type RMI-TI-020/100 mesh titanium and 2 percent −325 mesh nickel powder. The powders were mixed, pressed into a ½ inch diameter pellet and sintered at 1500° C. for 5 to 10 minutes. The pellet was reground, pressed in a 3/16 inch diameter die at 92,000 psi and sintered a second time at 1500° C. for 5 to 10 minutes. The pieces held shape well and were 99.5 percent of the theoretical density of the nickel-free molybdenum alloy. X-ray diffraction studies of the sintered pieces showed a major phase of molybdenum and titanium in solid solution and minor phases of $Ti_2Ni$ and $Ti_2O$. Metallographic and scanning electron microprobe studies showed the molybdenum-titanium alloy grains to contain some nickel but much of the nickel was concentrated in the grain boundary phase.

EXAMPLE II

The double sintering process described in Example I was repeated with a nickel-free composition wherein molybdenum and titanium were in a 2 to 1 weight ratio. The density of the sintered pieces was only 72 percent of the theoretical density of the nickel free molybdenum-alloy.

EXAMPLE III

A molybdenum alloy was prepared from 66 percent Sylvania type 390/325 mesh molybdenum, and 33 percent RMI Company type RMI-TI-020/100 mesh titanium and 1 percent −325 mesh nickel powder. The powders were mixed, pressed and sintered at 1500° C. for 5 to 10 minutes. The sintered pieces were then reground, pressed in a 3/16 inch diameter die at 92,000 psi and resintered at 1500° C. for 5 to 10 minutes. The resultant sintered pieces containing 1 percent nickel were 92.3 percent of the theoretical density of the nickel-free molybdenum alloy. X-ray diffraction studies of the pieces showed a single phase solid solution of molybdenum and titanium. Metallographic studies showed no grain boundary phase indicating that the nickel remains in solid solution with the molybdenum and titanium.

Four cylindrical specimens of this alloy having diameters of 0.17 inches and a total length of 0.796 inches were measured using a dilatometer calibrated against molybdenum. The thermal expansion of the molybdenum-titanium-nickel alloy is plotted in FIG. 1. The average thermal coefficient of expansion between 25° C. and 800° C. was determined to be $84.1\times10^{-7}$/°C.

EXAMPLE IV

A molybdenum alloy was prepared from 64 percent Sylvania type 390/325 mesh molybdenum, 32 percent RMI Company type RMI-TI-020/100 mesh titanium and 4 percent −325 mesh nickel powder. The powders were mixed, pressed into a ½ inch diameter pellet and sintered at 1500° C. for 5 minutes. The pieces were then reground, pressed into a 3/16 inch diameter die at 92,000 psi and resintered at 1500° C. for 5 minutes. The sintered pieces were 95.5 percent of the theoretical density of the nickel free molybdenum alloy. However, the parts showed some deformation during sintering.

EXAMPLE V

In this example, a high pressure sodium discharge lamp was constructed with a sintered molybdenum alloy closure member. A closure member containing 65.5 percent molybdenum, 32.5 percent titanium and 2 percent nickel was prepared in accordance with the procedure of Example I. A sintered piece having the general configuration of the closure member shown in FIG. 3 was ground to fit a 0.125 inch hole in a 150 watt polycrystalline alumina arc tube. A standard electrode and a connection lead were attached to the closure member. A preformed frit ring of calcium aluminate was placed between the arc tube and the closure member. The arc tube was heated to 1400° C. in the region of the closure member in an inert gas filled furnace to allow the frit ring to melt and form the seal between the discharge tube and the closure member. The seal was found to be hermetic under helium leak testing.

The discharge tube was then filled with 30 mg of a sodium amalgam and 20 torr of argon and the opposite end of the discharge tube was sealed with a standard niobium feedthrough using standard sealing methods. The discharge tube was tested and found to be operational.

The discharge tube was then temperature cycled to test the integrity of the seal between the alumina arc tube and the molybdenum alloy. A temperature cycle consisted of 5 minutes on followed by 5 minutes off. After 13,400 cycles, the seals were still intact and the discharge tube was still operational without degradation of light output or starting behavior.

EXAMPLE VI

Closure members containing 66 percent molybdenum, 33 percent titanium and 1 percent nickel were prepared in accordance with the procedure of Example III. A high pressure sodium discharge lamp was constructed as described in Example V except that both ends of the arc tube were sealed with molybdenum-titanium-nickel closure members. The seals were hermetic and the arc tube was fully operational.

While there has been shown and described what is at present considered the preferred embodiments of the invention, it will be obvious to those skilled in the art that various changes and modifications may be made therein without departing from the scope of the invention as defined by the appended claims.

What is claimed is:

1. A vacuum-tight assembly comprising:

a high density polycrystalline ceramic body having a cavity; and means for sealing said cavity from the atmosphere;

said ceramic body having a thermal coefficient of expansion between about $55\times10^{-7}$/°C. and $90\times10^{-7}$/°C.;

said means for sealing comprising

- a sintered closure member formed from a molybdenum alloy containing between 2 and 70 atom percent titanium and between 0.1 and 5 weight percent of a metal selected from the group consisting of nickel, cobalt, copper and mixtures thereof; and
- a sealing material interposed between said ceramic body and said closure member for providing a seal therebetween, said closure member and said sealing material having thermal coefficients of expansion closely matched to the thermal coefficients of expansion of said ceramic body over a wide temperature range.

2. A vacuum-tight assembly as defined in claim 1 wherein said ceramic body includes a material selected from the group consisting of alumina and yttria.

3. A vacuum-tight assembly as defined in claim 2 wherein said closure member contains between 0.5 and 2 weight percent of a metal selected from the group consisting of nickel, cobalt, copper and mixtures thereof.

4. A vacuum-tight assembly as defined in claim 3 wherein said closure member contains between 35 and 65 atom percent titanium.

5. A vacuum-tight assembly as defined in claim 4 wherein said ceramic body comprises a cylindrical discharge tube and wherein said closure member is adapted for sealing an end of said discharge tube.

6. A vacuum-tight assembly as defined in claim 2 wherein said closure member contains between 0.5 and 2 weight percent nickel.

7. A vacuum-tight assembly as defined in claim 1 wherein said closure member and said sealing material have thermal coefficients of expansion closely matched to the thermal coefficient of expansion of said ceramic body over the operating temperature range of said assembly.

8. A vacuum-tight assembly as defined in claim 3 wherein said closure member and said sealing material have thermal coefficients of expansion matched within seven percent to the thermal coefficient of expansion of said ceramic body over the temperature range 25° C. to 800° C.

9. A vacuum-tight assembly as defined in claim 1 wherein said sealing material is a meltable frit.

10. A vacuum-tight assembly as defined in claim 9 wherein said meltable frit is calcium aluminate.

* * * * *